(12) United States Patent  
Hung et al.

(10) Patent No.: US 9,391,647 B2
(45) Date of Patent: Jul. 12, 2016

(54) DECODER AND DECODING METHOD THEREOF FOR MIN-SUM ALGORITHM LOW DENSITY PARITY-CHECK CODE

(71) Applicant: STORART TECHNOLOGY CO. LTD., Hsinchu (TW)

(72) Inventors: Jui-Hui Hung, Tainan (TW); Chih-Nan Yen, Hsinchu (TW)

(73) Assignee: STORART TECHNOLOGY CO., LTD., Hsinchu (TW)

( * ) Notice: Subject to any disclaimer, the term of this patent is extended or adjusted under 35 U.S.C. 154(b) by 146 days.

(21) Appl. No.: 14/335,392

(22) Filed: Jul. 18, 2014

(65) Prior Publication Data

US 2016/0020786 A1    Jan. 21, 2016

(51) Int. Cl.
*H03M 13/00*    (2006.01)
*H03M 13/11*    (2006.01)
(Continued)

(52) U.S. Cl.
CPC .......... *H03M 13/6566* (2013.01); *H03M 13/11* (2013.01); *H03M 13/1102* (2013.01); *H03M 13/112* (2013.01); *H03M 13/114* (2013.01); *H03M 13/1105* (2013.01); *H03M 13/1114* (2013.01); *H03M 13/1122* (2013.01); *H03M 13/1131* (2013.01); *H03M 13/1162* (2013.01); *H03M 13/3746* (2013.01); *H04L 1/0061* (2013.01)

(58) Field of Classification Search
CPC ...................... H03M 13/6566; H03M 13/1122; H03M 13/1131; H03M 13/114; H03M 13/11; H03M 13/112; H03M 13/1162; H03M 13/1114; H03M 13/6505; H03M 13/3746; H03M 13/1102; H03M 13/1105; H04L 1/0061

USPC .......... 714/752, 763, 766, 768, 773, 780, 786, 714/799
See application file for complete search history.

(56) References Cited

U.S. PATENT DOCUMENTS

| | | | |
|---|---|---|---|
| 8,347,167 B2 * | 1/2013 | Andreev ........... | H03M 13/1122 714/752 |
| 8,930,790 B1 * | 1/2015 | Tsatsaragkos ...... | G06F 11/0751 714/752 |
| 8,990,661 B1 * | 3/2015 | Micheloni .......... | H03M 13/114 714/758 |

(Continued)

OTHER PUBLICATIONS

Huang, Single-Scan Min-Sum Algorithms for Fast Decoding of LDPC Codes, Sep. 16, 2006, IEEE, pp. 1-4.*

(Continued)

*Primary Examiner* — John J Tabone, Jr.
(74) *Attorney, Agent, or Firm* — Li & Cai Intellectual Property (USA) Office

(57) ABSTRACT

The present disclosure illustrates a decoder for min-sum algorithm low density parity-check code. The decoder is adapted for decoding coding data having bit nodes and check nodes. The decoder includes a calculation module and a memory. The calculation module includes a plurality of calculation units, and the memory includes a plurality of memory units. Each calculation unit includes a check node unit, a first message re-constructor and a second message re-constructor. The calculation module divides the coding data into several data groups, and the data group is calculated by each calculation unit. The check node unit generates a stored-form of a calculating result by calculating the respective data group. The calculating result is reconstructed by the first message re-constructor and summed with the following data group. The memory unit stores the respective calculating result generated from the calculation unit.

11 Claims, 4 Drawing Sheets

(51) Int. Cl.
*H03M 13/37* (2006.01)
*H04L 1/00* (2006.01)

(56) References Cited

U.S. PATENT DOCUMENTS

| | | | | |
|---|---|---|---|---|
| 2006/0026486 A1* | 2/2006 | Richardson | H03M 13/1105 | 714/758 |
| 2008/0183821 A1* | 7/2008 | Park | H03M 13/1111 | 709/205 |
| 2009/0070659 A1* | 3/2009 | Zhong | H03M 13/1122 | 714/801 |
| 2012/0185750 A1* | 7/2012 | Hayami | H03M 13/1111 | 714/758 |
| 2013/0061114 A1* | 3/2013 | Malmirchegini | H03M 13/1117 | 714/763 |
| 2013/0246882 A1* | 9/2013 | Hayami | H03M 13/1117 | 714/752 |
| 2013/0268821 A1* | 10/2013 | Hayami | H03M 13/112 | 714/752 |
| 2013/0272456 A1* | 10/2013 | Hayami | H03M 13/112 | 375/340 |
| 2014/0281762 A1* | 9/2014 | Norrie | G06F 11/2215 | 714/703 |
| 2014/0281800 A1* | 9/2014 | Micheloni | G06F 11/1012 | 714/759 |
| 2014/0281823 A1* | 9/2014 | Micheloni | G06F 11/1012 | 714/773 |
| 2015/0067440 A1* | 3/2015 | Owen | H03M 13/1114 | 714/758 |
| 2015/0349800 A1* | 12/2015 | Lin | H03M 13/1111 | 714/758 |

OTHER PUBLICATIONS

Ji, Research on High Performance LDPC Decoder, Feb. 2007, Waseda University, pp. i-xii and 1-104.*

* cited by examiner

DECODER AND DECODING METHOD THEREOF FOR MIN-SUM ALGORITHM LOW DENSITY PARITY-CHECK CODE

BACKGROUND

1. Technical Field

The present disclosure relates to a density parity-check code decoder, in particular, to a min-sum algorithm low density parity-check code decoder and a decoding method thereof.

2. Description of Related Art

During data transmission, data may be lost or damaged due to the poor reliability of the transmission medium or external interferences. Error correcting code or error control code has been designed for correcting the damaged or lost data and the reconstruction of the raw data. Common error correcting codes include Hamming Code, Reed Solomon Code, Bose Chaudhuri Hocquengham (BCH) Code, and Low Density Parity Check (LDPC) Code. The low density parity-check code has better capability of error detecting and error correcting than others, and it can decode at a high-speed rate. In the parallel-structure design of the traditional low density parity-check code decoder, in order to increase the computing parallelism and avoid the writing/reading problem in the row blocks and column blocks of the memory, the decoder usually divides the memory into memory blocks by the cyclic matrix unit, and operates writing or reading the memory blocks at the same time.

Please refer to FIG. 1. FIG. 1 is a diagram of a conventional low density parity-check code decoder. The decoder 1 includes a memory 11 and a calculation module 12. The calculation module 12 includes a plurality of calculation units 12-1, 12-2 . . . , 12-$n$. The calculation units 12-1, 12-2 . . . , 12-$n$ are coupled to the memory 11. Traditionally, the decoder 1 stores the data generated from the calculating of the iteration. Thus, the calculation units 12-1, 12-2 . . . , 12-$n$ will connect to the external memory 11. However, data collision may occur for each calculation unit 12-1, 12-2 . . . , 12-$n$ when writing or reading in the way of sharing the storage of memory 11.

Therefore, although the low density parity-check code includes a plurality of advantages, there exist many problems such as the data collision, circuit area, and calculating complexity that need improvement.

SUMMARY

An exemplary embodiment of the present disclosure provides a min-sum algorithm low density parity-check code coder, adapted for decoding coding data having bit nodes and check nodes. The decoder includes a calculation module and a memory. The calculation module includes a plurality of calculation units, and the memory includes a plurality of memory units. Each calculation unit includes a check node unit, a first message re-constructor and a second message re-constructor. The memory is coupled to the calculation module. Each memory unit is coupled to each respective calculation unit. The first message re-constructor and the second message re-constructor are coupled to the check node unit. The calculation module is configured for dividing the coding data into several data groups, and the calculation units are configured for operatively calculating the respective data group. The check node unit is configured for generating a stored-form of a calculating result by calculating the respective data group. The calculating result is reconstructed by the first message re-constructor and summed with the following data group. The memory unit is configured for storing the respective calculating result generated from the calculation unit.

An exemplary embodiment of the present disclosure provides a min-sum algorithm low density parity-check code method, adapted for decoding coding data having bit nodes and check nodes, comprises following steps: coding data is divided into several data groups; a check node unit of a calculation unit calculates the respective data group to generate a calculating result in a stored-form; a plurality of memory units are configured for storing the respective calculation results on a one on one basis; each calculating result stored in the memory unit is reconstructed by a first message re-constructor and performed by a first sum calculation with the following data group; and each calculating result is reconstructed into a outputted-form by a second message re-constructor.

To sum up, a min-sum algorithm low density parity-check code coder and the method provided by the exemplary embodiment of the present disclosure can avoid data collision occurring as the traditional coder performs the process of writing and reading. More specifically, since the data required to store generated by the coder calculating in the min-sum algorithm is not complicated, the calculation unit of the present disclosure stores and reads the respective memory storage on a one on one basis, so as to avoid the data collision occurring when the traditional coder utilizes the shared memory storage. On the other hand, the cost of the traditional coder in the way of sharing memory storage will be raised with the length of coding data and the string increasing. Therefore, the present disclosure decreases the whole storage of the memory required by using a plurality of memory units to store the respective calculating data.

In order to further understand the techniques, means and effects of the present disclosure, the following detailed descriptions and appended drawings are hereby referred to, such that, and through which, the purposes, features and aspects of the present disclosure can be thoroughly and concretely appreciated, however, the appended drawings are merely provided for reference and illustration, without any intention that they be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
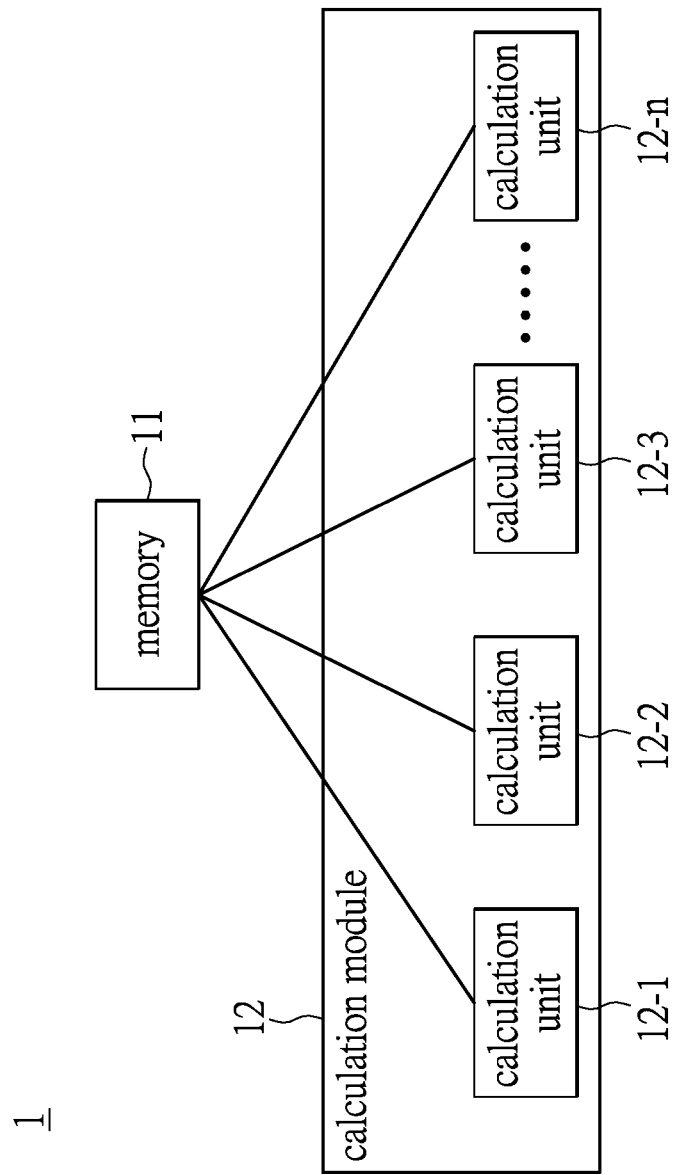
FIG. 1 is a diagram of a conventional low density parity-check code decoder.

Reference will now be made in detail to the exemplary embodiments of the present disclosure, examples of which are illustrated in the accompanying drawings. However, they may be embodied in different forms and should not be construed as limited to the embodiments set forth herein. In the drawings, the thickness and relative thickness of layers and regions may be exaggerated for clarity. Wherever possible, the same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of the embodiments. As used herein, the term "or" includes any and all combinations of one or more of the associated listed items.

Figure 2:
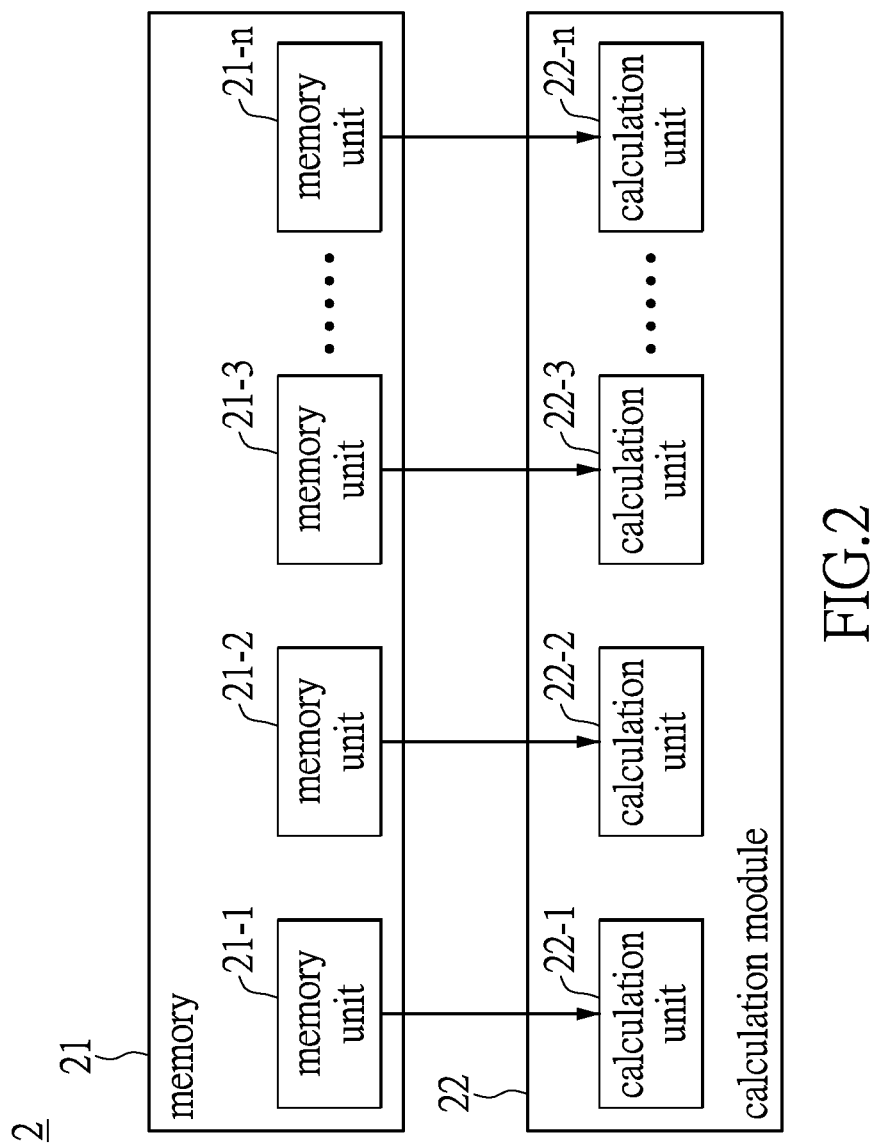
FIG. 2 is a diagram of a min-sum algorithm low density parity-check code decoder of an embodiment according to the present disclosure.

Please refer to FIG. 2, which is a diagram of a min-sum algorithm low density parity-check code decoder of an embodiment according to the present disclosure. The decoder 2 includes a memory 21 and a calculation module 22. The memory 21 includes memory units 21-1, 21-2 . . . , 21-$n$, and the calculation module 22 includes calculation units 22-1, 22-2 . . . , 22-$n$. The calculation units 22-1, 22-2 . . . , 22-$n$ are coupled to each respective memory unit 21-1, 21-2 . . . , 21-$n$. The present disclosure is a decoder 2 utilizing the low density parity-check code, configured for decoding coding data having bit nodes and check nodes to generate decoding data and confirm the correctness thereof. The coding data is coded from original data (not illustrated) by a coder. The knowledge of the bit nodes and the check nodes in the error correcting code is known by those persons skilled in the art, so it is omitted.

The calculation module 22 is configured for calculating the received coding data. The calculation module 22 divides the low density parity-check code coding data having the bit nodes and the check nodes into a plurality of data groups to provide performing decode process thereafter. The data group includes a plurality of data bit-strings. In the embodiment of the present disclosure, the calculation module 22 calculates the low density parity-check code coding data based on the min-sum algorithm (MSA). More specifically, the calculation module 22 performs the calculating process said above to each respective data group by the calculation units 22-1, 22-2 . . . , 22-$n$. For instance, the calculation module 22 divides the coding data into 15 data groups. The calculation unit 22-1 receives the first data group and calculates thereon. In the same way, the calculation unit 22-2 receives the second data group and calculates thereon, and so on. In the embodiment of the present disclosure, the calculation units 22-1, 22-2 . . . , 22-$n$ can be a central process unit (CPU), a micro control unit (MCU), or another components having computing capability, and is not limited thereto. It is worth noting, the present disclosure is not limited the kinds of the min-sum algorithm, it also can be implemented by a self-corrected min-sum algorithm, a modified min-sum algorithm, optimized min-sum algorithm, or etc.

In the embodiment of the present disclosure, the memory 21 is configured for storing calculating result generated from the calculation units 22-1, 22-2 . . . , 22-$n$. In detail, the embodiment of the present disclosure utilizes the memory 21 constructed by memory units 21-1, 21-2 . . . , 21-$n$ to provide each respective calculation unit 22-1, 22-2 . . . , 22-$n$ storing on a one on one basis.

Figure 3:
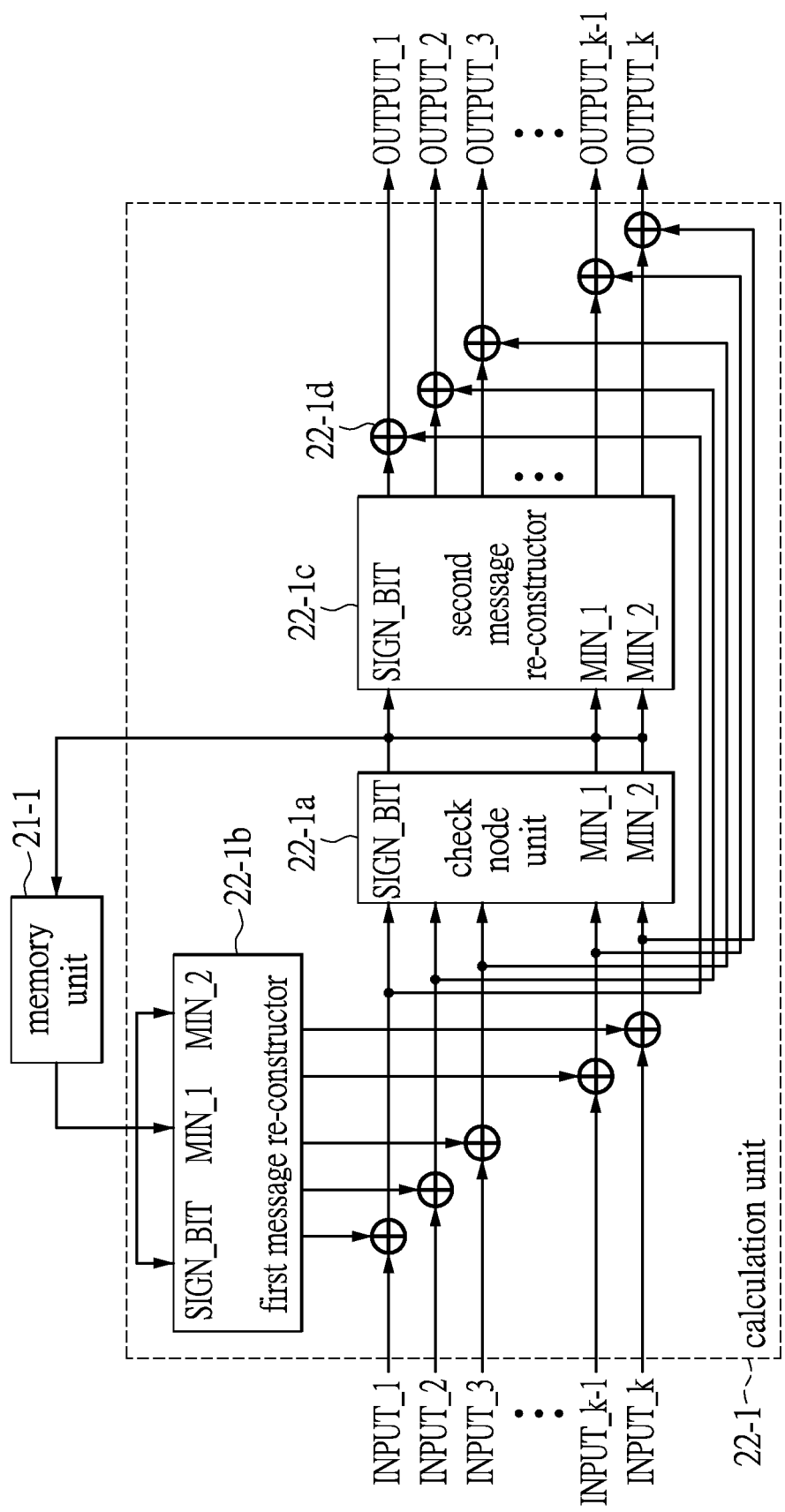
FIG. 3 is a diagram of detail components within a calculation unit of the low density parity-check code decoder of the embodiment according to the present disclosure.

Then, please refer to FIG. 3 in conjunction with FIG. 2, FIG. 3 is a diagram of detailed components within a calculation unit of the low density parity-check code decoder of an embodiment according to the present disclosure. It is worth noting, each calculation unit 22-1, 22-2 . . . , 22-$n$ includes a check node unit 22-1$a$, first message re-constructor 22-1$b$, second message re-constructor 22-1$c$, a plurality of adders 22-1$d$, a plurality of inputs INPUT_1, INPUT_2 . . . , INPUT_k, and a plurality of outputs OUTPUT_1, OUTPUT_2 . . . , OUTPUT_k. However, the present disclosure is only illustrated by the calculation unit 22-1 and the memory unit 21-1 in FIG. 3.

The check node unit 22-1$a$ is configured for generating the calculating result in a stored-form upon calculating the received data group. More specifically, the calculation unit 22-1 receives the k data bit-strings of the data group respectively by each INPUT_1, INPUT_2 . . . , INPUT_k, wherein the length of each data bit-string is r, which is an integer and r≥1. The check node unit 22-1$a$ performs the calculating based on the min-sum algorithm to generate the calculating result in the stored-form. A first minimum bit-string, a second minimum bit-string, a first minimum address bit-string, and each data sign bit-string of the data bit-string are important in the min-sum algorithm process as known by persons skilled in the art. Thus, after calculating by the check node unit 22-1$a$, first minimum bit-string and the first minimum address bit-string are outputted by a first minimum bit-string input/output terminal MIN_1 of the check node unit 22-1$a$, the second minimum bit-string is outputted by a second minimum bit-string input/output terminal MIN_2, and the data sign bit-string is outputted by a data sign bit-string input/output terminal SIGN_BIT. The first minimum bit-string, the second minimum bit-string, the first minimum address bit-string, and the data sign bit-string are stored in the memory unit 21-1 in the stored-form. Wherein the length of data sign bit-string is equal to the length of the data bit-string. In addition, since the min-sum algorithm is performed in binary and the length of data bit-string is r, the length needed for storing the minimum address bit-string is found by ceil($Log_2$ r). The present disclosure denotes the ceil($Log_2$ r)=L. The knowledge of the min-sum algorithm process is known by those persons skilled in the art, so it is omitted.

The memory unit 21-1 is configured for storing the calculating result in the stored-form generated from the calculation unit 22-1. In the embodiment of the present disclosure, the decoder calculates the min-sum algorithm low density parity-check code in iteration. Thus, each calculating result shall be stored by the corresponding memory unit 21-1. The calculating result includes the first minimum bit-string, the first minimum address bit-string, the second minimum bit-string and the data sign bit-string of the data group generated by the calculation unit 22-1, wherein the memory unit 21-1 includes a plurality of storages. The number of the storages within the memory unit is equal to the number of the check nodes of each data group. It is worth to note, a storage length of the storage is greater than or equal to the total length which sums the first minimum bit-string, the length of the second minimum bit-string, the first minimum address bit-string, and the data sign bit-string. The memory unit 21-1 can be implemented by a flash memory chip, a read only memory chip, or a random access memory chip such as a volatility or non-volatility memory chip, but the present disclosure is not limited thereto.

In the iteration calculating by the check node unit 22-1$a$, the first message re-constructor unit 22-1$b$ is configured for re-constructing the calculating result stored in the memory unit 21-1 from the stored-form into the calculated-form. Then, the calculating result in the calculated-form is performed by a first sum calculation by the adder 22-1$d$ with the following data group to generate a first calculating value. More specifically, the first minimum bit-string and the first minimum address bit-string in the stored-form are received by the first minimum bit-string input/output terminal MIN_1 of the first message re-constructor unit 22-1*b*. The second minimum bit-string in the stored-form is received by the second minimum bit-string input/output terminal MIN_2 of the first message re-constructor unit 22-1*b*. The data sign bit-string in the stored-form is received by the data sign bit-string input/output terminal SIGN_BIT of the first message re-constructor unit 22-1*b*. After the first message re-constructor unit 22-1*b* receives the bit-strings in the stored-form said above, the first calculating value is outputted to calculate with the following data group in the next calculation by the adders 22-1*d*.

If the iteration calculating achieves the condition to stop, the check node unit 22-1*a* outputs the calculating result; that is the check node unit 22-1*a* achieves the condition that a count of calculation is equal to a predetermined value or a syndrome text is equal to zero. In detail, the second message re-constructor unit 22-1*c* is configured for receiving the last one message comprising the first minimum bit-string, the first minimum address bit-string, the second minimum bit-string, and the data sign bit-string upon the calculation being finished, to re-construct the calculating result of the decoding data group to the outputted-form. Then, the adders 22-1*d* further perform a second sum calculation to the calculating result of the decoding data group with the first calculating result of the first sum calculation. After the adders 22-1*d* perform the second sum calculation, it outputs the final result from each respective output OUTPUT_1, OUTPUT_2 . . . , OUTPUT_k, to provide the calculation unit 22-1 to integrate the decoding data group and generate the decoding data.

Figure 4:
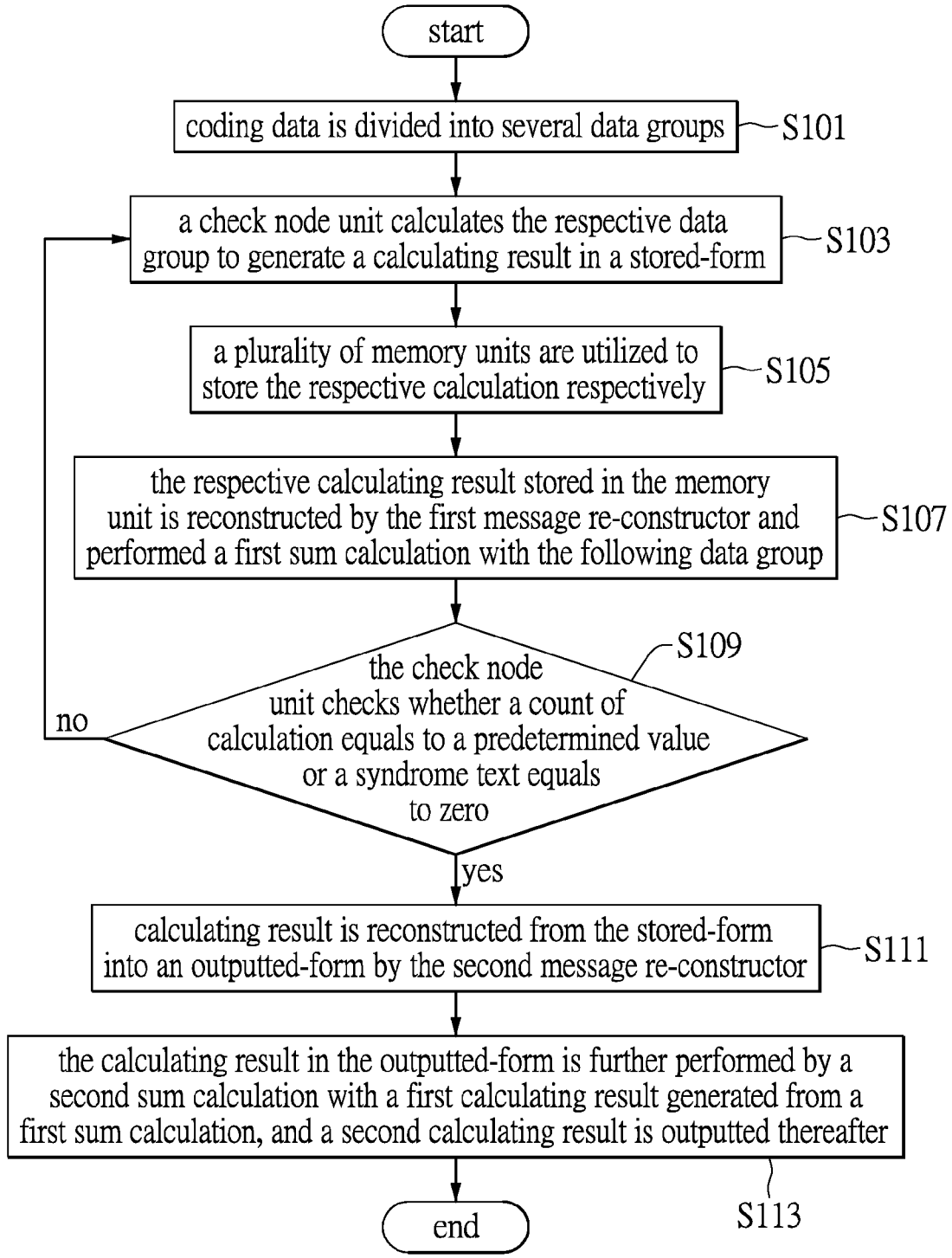
FIG. 4 is a flow chat of a min-sum algorithm low density parity-check code method of an embodiment according to the present disclosure.

After that, please refer to FIG. 4, FIG. 4 is a flow chat of a min-sum algorithm low density parity-check code method of an embodiment according to the present disclosure. The decoding method includes the following steps: in the step S101, coding data is divided into several data groups; in the step S103, a check node unit calculates the respective data group to generate a calculating result in a stored-form; in the step S105, a plurality of memory units are utilized to store the respective calculations respectively; in the step S107, the respective calculating result stored in the memory unit is reconstructed by the first message re-constructor which performs a first sum calculation with the following data group; in the step S109, the check node unit checks whether a count of calculation equals to a predetermined value or a syndrome text equals to zero; in the step S111, the calculating result is reconstructed from the stored-form into an outputted-form by the second message re-constructor; in the step S113, the calculating result in the outputted-form is further performed by a second sum calculation with a first calculating result generated from a first sum calculation, and a second calculating result is outputted thereafter.

Please refer to FIG. 4 in conjunction with FIG. 2. In the step S101, the calculation module 22 divides the low density parity-check coding data having bit nodes and check nodes into a plurality of the data groups to perform the decoding process hereafter. The data group includes a plurality of bit-strings.

Then, in the step S103, the check node unit 22-1*a* is configured for calculating the received data group and generating the calculating result in stored-form. A first minimum bit-string, a second minimum bit-string, a first minimum address bit-string, and each data sign bit-string of the data bit-string are important in the min-sum algorithm process as known by persons skilled in the art.

Please refer to FIG. 4 in conjunction with FIG. 3. In the step S105, after calculating by the check node unit 22-1*a*, first minimum bit-string and the first minimum address bit-string are outputted by a first minimum bit-string input/output terminal MIN_1 of the check node unit 22-1*a*, the second minimum bit-string is outputted by a second minimum bit-string input/output terminal MIN_2, and the data sign bit-string is outputted by a data sign bit-string input/output terminal SIGN_BIT. The first minimum bit-string, the second minimum bit-string, the first minimum address bit-string, and the data sign bit-string are stored in the memory unit 21-1 in the stored-form, wherein the length of data sign bit-string is equal to the length of the data bit-string. In addition, since the min-sum algorithm is performed in binary and the length of data bit-string is r, the length needed for storing the minimum address bit-string is enough is found by ceil($Log_2$ r), wherein the memory unit 21-1 includes a plurality of storages. It is worth noting, a storage length of the storage is greater than or equal to the total length which sums the first minimum bit-string, the length of the second minimum bit-string, the first minimum address bit-string, and the data sign bit-string.

In the step S107, by the check node unit 22-1*a*, the first message re-constructor unit 22-1*b* is configured for re-constructing the calculating result stored in the memory unit 21-1 from the stored-form into the calculated-form. Then, a first sum calculation is performed on the calculating result in the calculated-form by the adder 22-1*d* with the following data group to generate a first calculating value. In the step S109, the check node unit 22-1*a* determines whether to stop the calculating according to a predetermined value or a syndrome text. If the determination is YES, and it goes to step S111; or if the determination is NO, it returns to the step S103.

In the step S111, if the iteration calculating achieves the condition to stop, the check node unit 22-1*a* outputs the calculating result in the outputted-form; that is the check node unit 22-1*a* achieves the condition that a count of calculation is equal to a predetermined value or a syndrome text is equal to zero. In the step S113, the adders 22-1*d* further perform a second sum calculation to the calculating result of the decoding data group in the outputted-form with the first calculating result of the first sum calculation. Finally, after performed the second sum calculation, the adders 22-1*d* output the final result from each respective output OUTPUT_1, OUTPUT_2 . . . , OUTPUT_k, to provide the calculation unit 22-1 to integrate the decoding data group and generate the decoding data.

To sum up, a min-sum algorithm low density parity-check code coder and the method provided by the exemplary embodiment of the present disclosure can avoid the data collision that occurs as the traditional coder performs the process of writing and reading. More specifically, since the data required to store generated by the coder calculating in the min-sum algorithm is not complicated, the calculation unit of the present disclosure stores and reads the respective memory storage on a one on one basis, so as to avoid the data collision occurring when the traditional coder utilizes the memory storage in sharing. On the other hand, the cost of the traditional coder in the way of sharing memory storage is raised with the length of coding data and the string increasing. Therefore, the present disclosure decreases the whole storage of the memory required by utilizing a plurality of memory units to store the respective calculating data.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A min-sum algorithm low density parity-check code decoder, configured to decode coding data having bit nodes and check nodes, comprising:
a calculation module, configured to divide the coding data into a plurality of data groups, comprising:
a plurality of calculation units, wherein each calculation unit configured to operatively calculate a respective data group of the data groups, comprises:
a check node unit, configured to operatively generate a calculating result in a stored-form by calculating the respective data group; and
a first message re-constructor, coupled to the check node unit, configured to operatively reconstruct the calculating result to a calculated-form and summing the calculating result with a following data group; and
a second message re-constructor, coupled to the check node unit, configured to operatively reconstruct the calculating result from the stored-form into a outputted-form; and
a memory, coupled to the calculation module, comprising:
a plurality of memory units, wherein each memory unit is coupled to a respective calculation unit of the calculation units, and configured to store the calculating result generated from the respective calculation unit.

2. The min-sum algorithm low density parity-check code decoder according to claim 1, wherein each memory unit comprises a plurality of storages.

3. The min-sum algorithm low density parity-check code decoder according to claim 2, wherein a number of the storages within each memory unit is equal to a number of the check nodes of each data group.

4. The min-sum algorithm low density parity-check code decoder according to claim 1, wherein each data group comprises a plurality of data bit-strings.

5. The min-sum algorithm low density parity-check code decoder according to claim 4, wherein the calculating result comprises a first minimum bit-string, a second minimum bit-string, a first minimum address bit-string, and a data sign bit-string.

6. The min-sum algorithm low density parity-check code decoder according to claim 5, wherein a length of the data sign bit-string is equal to a length of each data bit-string.

7. The min-sum algorithm low density parity-check code decoder according to claim 5, wherein a length of the first minimum address bit-string is L, wherein $L=\text{ceil}(\text{Log}_2 r)$.

8. The min-sum algorithm low density parity-check code decoder according to claim 5, wherein a storage length of each storage is greater than or equal to a total length which sums a length of the first minimum bit-string, a length of the second minimum bit-string, a length of the first minimum address bit-string, and a length of the data sign bit-string.

9. The min-sum algorithm low density parity-check code decoder according to claim 1, wherein each calculation unit comprises:
a plurality of inputs, configured to respectively receive a plurality of data bit-strings of the respective data group;
wherein a length of each data bit-string is r, which is an integer and $r \geq 1$.

10. The min-sum algorithm low density parity-check code decoder according to claim 1, wherein a min-sum algorithm used is a modified min-sum algorithm.

11. A min-sum algorithm low density parity-check code method, configured to decode coding data having bit nodes and check nodes, comprising:
the coding data is divided into a plurality of data groups;
a plurality of calculation units having check node units respectively, and each check node unit of each calculation unit calculates a respective data group of the data groups to generate a calculating result in a stored-form;
a plurality of memory units are configured to store the calculation results respectively;
each calculating result stored in the memory unit is reconstructed by a first message re-constructor and performed by a first sum calculation with a following data group; and
each calculating result is reconstructed into an outputted-form by a second message re-constructor.

* * * * *